United States Patent [19]

Baek

[11] Patent Number: 6,127,668

[45] Date of Patent: Oct. 3, 2000

[54] SOLID STATE IMAGE PICKUP DEVICE AND METHOD FOR MANUFACTURING THE SAME

[75] Inventor: Euy Hyeon Baek, Chungcheongbuk-do, Rep. of Korea

[73] Assignee: LG Semicon Co., Ltd., Chungcheongbuk-do, Rep. of Korea

[21] Appl. No.: 09/001,941

[22] Filed: Dec. 31, 1997

[30] Foreign Application Priority Data

Dec. 31, 1996 [KR] Rep. of Korea ...................... 96/79247

[51] Int. Cl.[7] .................................................. H01J 40/14
[52] U.S. Cl. ...................... 250/208.1; 250/216; 257/292; 257/294
[58] Field of Search .................................. 250/208.1, 239, 250/216; 457/294, 292, 432, 291; 359/619–622; 438/70–75, 144

[56] References Cited

U.S. PATENT DOCUMENTS

| | | | |
|---|---|---|---|
| 5,306,926 | 4/1994 | Yonemoto | 257/294 |
| 5,323,052 | 6/1994 | Koyama | 257/294 |
| 5,854,091 | 12/1998 | Back et al. | 257/294 |

*Primary Examiner*—Que T. Le
*Attorney, Agent, or Firm*—Birch, Stewart, Kolasch & Birch, LLP

[57] ABSTRACT

A solid state image pickup device including implanting impurity ions into a planarizing layer and/or a microlens layer thereon for changing a refractive index thereof, and method for fabricating such a device. The planarizing layer and the microlens layer are formed over components of the solid state image pickup device including a plurality of photoelectric conversion regions and charge coupled device (CCD) regions, each charge coupled device transferring an image charge generated in the photoelectric conversion regions in one direction.

26 Claims, 12 Drawing Sheets

F I G.2c
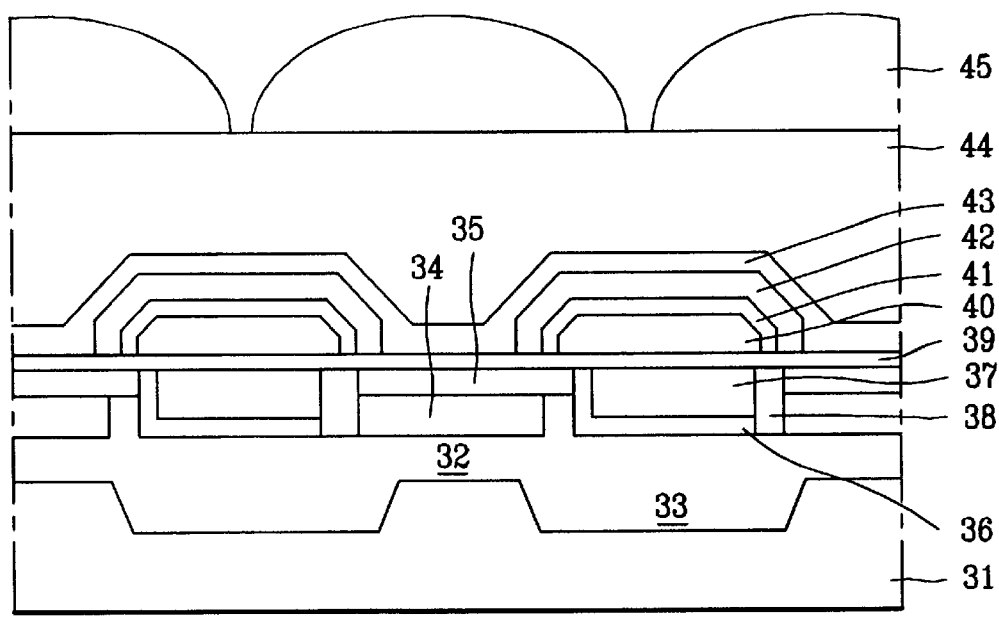

F I G.6a

| | |
|---|---|
| Mode | :n Float(Film 1) |
| Wavelength | :6328Å − G1 |
| Angle | : 70.00 |

150°C/300sec baking

| | Thickness | 6328Å n | k |
|---|---|---|---|
| Film | : 24000.0Å | 1.570 | 0.000 |
| Substrate | : | 3.865 | −0.020 |

| Point | X | Y | nFilm | Thick |
|---|---|---|---|---|
| --------- | --------- | Slot # 03 | --------- | --------- |
| 1 | 50.00mm | 0.00mm | 1.5273 | 23304.47Å |
| 2 | 1.97mm | 0.00mm | 1.5126 | 23701.67Å |
| 3 | −48.08mm | 0.00mm | 1.5472 | 22793.21Å |
| 4 | 0.00mm | −50.00mm | 1.5449 | 22837.21Å |
| 5 | 0.00mm | 50.00mm | 1.5273 | 23296.55Å |
| Mean | | | 1.5319 | 23186.62Å |
| Sigma | | | 0.0143 | 376.87Å |
| range | | | 0.0346 | 908.46Å |
| Max Min % | | | 1.1302 | 1.96 |
| Minimum | | | 1.5126 | 22793.21Å |
| Maximum | | | 1.5472 | 23701.67Å |

*measurements of refractive indexes prior to an ion implantation process*

F I G.6a (cont'd)

| Mode | :n Float (Film 1) | | | | |
|---|---|---|---|---|---|
| Wavelength | :6328A – G1 | | | | |
| Angle | :70.00° | 6328Å | | | |
| | Thickness | n | k | 150°C/300sec baking | |
| film1 | :24000.0A | 1.570 | 0.000 | | |
| Substrate | : | 3.865 | -0.020 | | |

```
              Point      X         Y      nFilm    Thick                Conditions for ion
           ------------- Slot #  02 -------------                         implantation
              1      50.00mm    0.00mm   1.6338  23080.32Å
              2       1.97mm    0.00mm   1.6346  23078.61Å
              3     -48.08mm    0.00mm   1.6361  23013.18Å
              4       0.00mm   -50.00    1.6355  23044.25Å             Dose : 1E14
              5       0.00mm    50.00    1.6334  23099.81Å  ①          Ib   : 100µA
Mean                                     1.6347  23063.23Å             energy : 80Kev
Sigma 1                                  0.0011    34.39Å              GAS  : Ar
range                                    0.0026    86.63Å
Max Min %                                0.0804     0.19Å
Minimum                                  1.6334  23013.18Å
Maximum                                  1.6361  23099.81Å

------------- Slot #  03 -------------
              1      50.00mm    0.00mm   1.5446  22831.45Å
              2       1.97mm    0.00mm   1.5440  22864.65Å
              3     -48.08mm    0.00mm   1.5579  25036.07Å
              4       0.00mm   -50.00    1.5438  22867.21Å             Dose : 1E11
              5       0.00mm    50.00    1.5568  25040.90Å  ②          Ib   : 50µA
Mean                                     1.5494  23728.06Å             energy : 80Kev
Sigma 1                                  0.0072  1196.34Å              GAS  : Ar
range                                    0.0141  2209.46Å
Max Min %                                0.4547     4.66
Minimum                                  1.5438  22831.45Å
Maximum                                  1.5579  25040.90Å

------------- Slot #  04 -------------
              1      50.00mm    0.00mm   1.5607  24958.82Å
              2       1.97mm    0.00mm   1.5596  25004.35Å
              3     -48.08mm    0.00mm   1.5690  24749.15Å
              4       0.00mm   -50.00    1.5679  24764.93Å             Dose : 1E13
              5       0.00mm    50.00    1.5662  24809.14Å  ③          Ib   : 20µA
Mean                                     1.5647  23728.06Å             energy : 80Kev
Sigma 1                                  0.0043   116.70Å              GAS  : Ar
range                                    0.0094   255.20Å
Max Min %                                0.2989     0.51
Minimum                                  1.5596  24749.15Å
Maximum                                  1.5690  25004.35Å
```

*measurements of refractive indexes after an ion implantation process*

F I G.6b

| Mode | :n Float (Film 1) | | | | |
|---|---|---|---|---|---|
| Wavelength | :6328Å − G1 | | | | |
| Angle | :70.00° | 6328Å | | | |
| | Thickness | n | k | 150°C/300sec baking | |
| film1 | :27000.0A | 1.570 | 0.000 | | |
| Substrate | : | 3.865 | −0.020 | | |

| | Point | X | Y | nFilm | Thick | Conditions for ion implantation |
|---|---|---|---|---|---|---|
| | --------- Slot # 07 --------- | | | | | |
| | 1 | 50.00mm | 0.00mm | 1.5196 | 23080.32Å | |
| | 2 | 1.97mm | 0.00mm | 1.4966 | 26847.53Å | |
| | 3 | −48.08mm | 0.00mm | 1.5318 | 25794.79Å | Dose : 1E14 |
| | 4 | 0.00mm | −50.00 | 1.5157 | 26263.19Å | Ib : 100μA |
| | 5 | 0.00mm | 50.00 | 1.4917 | 26988.41Å ① | energy : 80Kev |
| Mean | | | | 1.5111 | 23063.23Å | GAS : Ar |
| Sigma 1 | | | | 0.0167 | 497.60Å | |
| range | | | | 0.0401 | 1193.62Å | |
| Max Min % | | | | 1.3269 | 2.26 | |
| Minimum | | | | 1.4917 | 2594.79Å | |
| Maximum | | | | 1.5381 | 26988.41Å | |

*measurements of refractive indexes prior to an
ion implantation process*

FIG.6b (cont'd)

| | | | | | |
|---|---|---|---|---|---|
| Mode | :n Float (Film 1) | | | | |
| Wavelength | :6328Å – G1 | | | | |
| Angle | :70.00° | 6328Å | | | |
| | Thickness | n | k | 150°C/300sec baking | |
| film1 | :27000.0A | 1.570 | 0.000 | | |
| Substrate | : | 3.865 | -0.020 | | |

| Point | X | Y | nFilm | Thick | Conditions for ion implantation |
|---|---|---|---|---|---|
| ------- | Slot # 01 | ------- | | | |
| 1 | 50.00mm | 0.00mm | 1.6362 | 27837.28Å | |
| 2 | 1.97mm | 0.00mm | 1.6293 | 28048.21Å | |
| 3 | -48.08mm | 0.00mm | 1.6405 | 27713.15Å | Dose : 1E14 |
| 4 | 0.00mm | -50.00 | 1.6420 | 27662.31Å | Ib : 100μA |
| 5 | 0.00mm | 50.00 | 1.6365 | 27828.32Å ① | energy : 80Kev |
| Mean | | | 1.6369 | 23063.23Å | GAS : Ar |
| Sigma 1 | | | 0.0050 | 148.92Å | |
| range | | | 0.0401 | 385.90Å | |
| Max Min % | | | 0.0128 | 0.69 | |
| Minimum | | | 0.3906 | 27662.31Å | |
| Maximum | | | 1.6420 | 28048.21Å | |

*measurments of refractive indexes after an ion implantation process*

SOLID STATE IMAGE PICKUP DEVICE AND METHOD FOR MANUFACTURING THE SAME

BACKGROUND OF THE INVENTION

1. Field of the Invention

The present invention relates to a solid state image pickup device and to a method of manufacturing such a device. More particularly, the present invention relates to a solid state, micro-slim type semiconductor device having an enhanced sensitivity for image pickup, and a method for manufacturing the same.

2. Discussion of the Related Art

A general solid state image pickup device generates an image signal corresponding to a subject. In the device, a photoelectric conversion device (e.g., a photodiode) and a charge coupled device (CCD) are used to convert the image into an electric signal. The CCD transfer signal charge is generated in the photoelectric conversion device in a specific direction, based on changes of electric potential in a substrate.

A general solid state image pickup device includes a plurality of photoelectric conversion regions such as photodiodes (PD); a vertical charge coupled device (VCCD) region, formed between the plurality of photoelectric conversion regions, for transferring charge generated in the photoelectric conversion regions in a vertical direction; a horizontal charge coupled device (HCCD) region for transferring the charge that has been transferred from the VCCD region in a horizontal direction; and a floating diffusion region for sensing and amplifying the charge transferred in the horizontal direction and outputting it to a periphery circuit.

A conventional method for manufacturing a solid state image pickup device will be explained with reference to FIGS. 1a and 1b, which are cross-sectional views showing a structure of a conventional solid state image pickup device illustrating paths of incident light.

As shown in FIG. 1a, first and second $p^-$-type wells 12 and 13 are formed in an n-type substrate 11. Within wells 12 and 13, an $n^+$-type photodiode 14 and an $n^+$-type vertical charge coupled device VCCD 17 are formed, respectively. On the $n^+$-type photodiode region 14, a $p^+$-type surface-isolating layer 15 is formed. A third $p^-$-type well 16 is formed to surround the $n^+$-type VCCD 17. Then, a gate insulating layer 19 is formed on the entire surface of the substrate 11. Next, a transmitting gate 20, an interlayer insulating layer 21, and a metal shading layer 22 are sequentially formed on the gate insulating layer 19 and over the photodiode region 14, such that they are exclusive of the gate insulating layer 19. Subsequently, on the entire surface, there is formed a passivation layer 23, on which a planarizing layer 24 is formed. Thereafter, a microlens 25 is formed on the planarizing layer 24 opposite to the photodiode region 14. A channel stop layer 18 for isolating adjacent pixels is formed to surround the photodiode region 14.

In a conventional solid state image pickup device having the aforementioned structure, light incident through a camera lens is focused toward photodiode region 14 using microlens 25, as shown in FIG. 1a. The light transmitted to the photodiode region 14 is photoelectrically converted into image charge. The image charge is transferred from photodiode region 14 to a horizontal charge coupled device (HCCD) (not shown) in a vertical direction through the VCCD 17, using a VCCD clock signal. The image charge is then transferred through the HCCD in a horizontal direction, and finally is sensed and amplified at a floating diffusion region before being input to a periphery circuit.

In such a conventional solid state image pickup device, light is focused on photodiode region 14 using microlens 25, thus enhancing its sensitivity. However, as shown in FIG. 1b, the microlens 25 is less capable of focusing tilted light toward photodiode region 14. Thus, tilted light generates smear, effectively degrading resultant picture quality. In order to precisely focus incident light on a photodiode region through a microlens, the refractive index and transmissivity should be considered to determine an appropriate thickness of the microlens. It is therefore difficult to selectively change the thickness h. Furthermore, it is difficult to make the conventional device thin while addressing the problems with regard to tilted light.

SUMMARY OF THE INVENTION

The present invention is directed to a method for manufacturing a solid state image pickup device that substantially obviates one or more of problems due to limitations and disadvantages of the related art.

An object of the invention is to provide a method for manufacturing a solid state image pickup device suitable for obtaining a microslim type semiconductor device having an enhanced sensitivity.

To achieve these and other advantages and in accordance with the purpose of the present invention, as embodied and broadly described, the method for manufacturing a solid state image pickup device includes the step of implanting impurity ions into a planarizing layer or a microlens layer thereon. A refractive index is changed in the planarizing layer or the microlens layer formed over a solid state image pickup device including a plurality of photoelectric conversion regions and charge coupled device (CCD) regions, each for transferring image charge generated in the plurality of photoelectric conversion regions in one direction.

Additional features and advantages of the invention will be set forth in the description which follows and, in part, will be apparent from the description or may be learned by practice of the invention. The objectives and other advantages of the invention will be realized and attained by the structure particularly pointed out in the written description and claims hereof as well as the appended drawings.

It is therefore to be understood that both the foregoing general description and the following detailed description are exemplary and explanatory and a intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which:

FIGS. 2a to 2c are cross-sectional views showing states of a solid state image pickup device during various steps of a manufacturing process therefor according to a first embodiment of the invention;

FIGS. 6a and 6b show measurements according to changes of refractive indexes prior to, and after, an ion-implanting process.

DETAILED DESCRIPTION OF THE PREFERRED EMBODIMENTS

Reference will now be made in detail to the preferred embodiments of the present invention, examples of which are illustrated in the accompanying drawings.

Figure 1A:
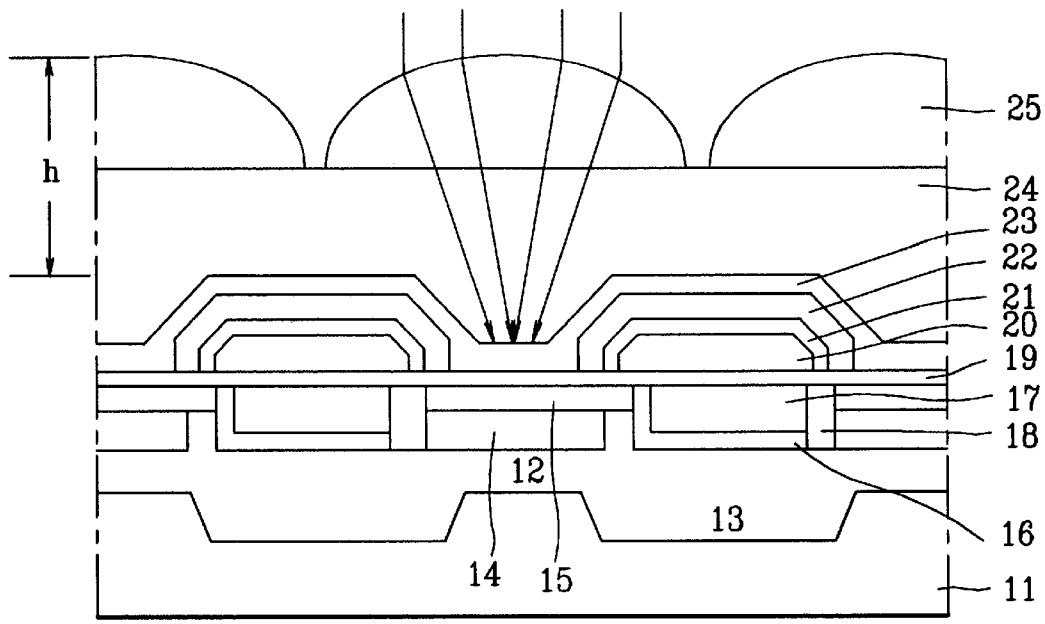
FIGS. 1a and 1b are cross-sectional views showing a structure of a conventional solid state image pickup device, and illustrating paths of light incident thereon.
Figure 1B:
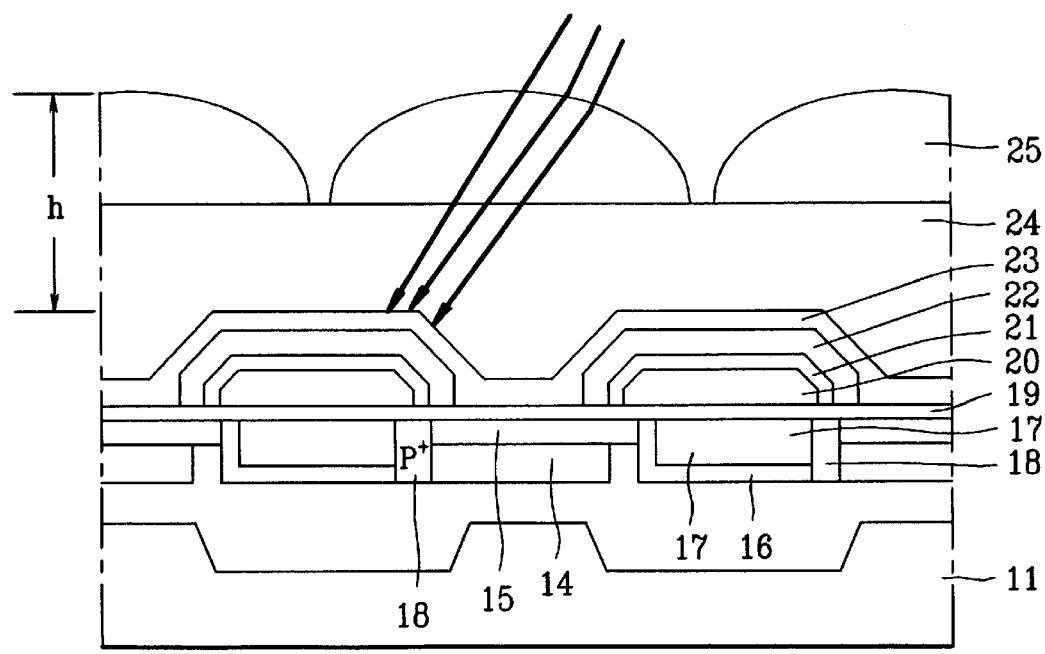
Figure 2A:
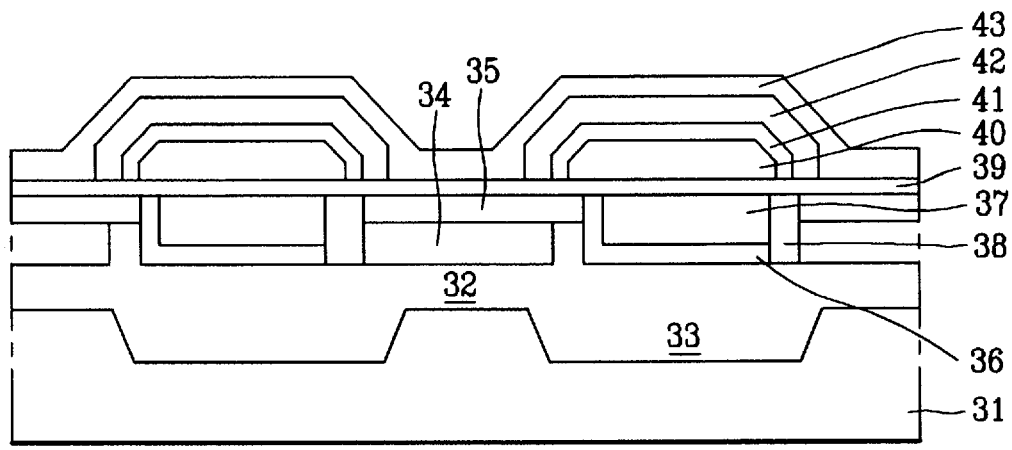
Figure 2B:
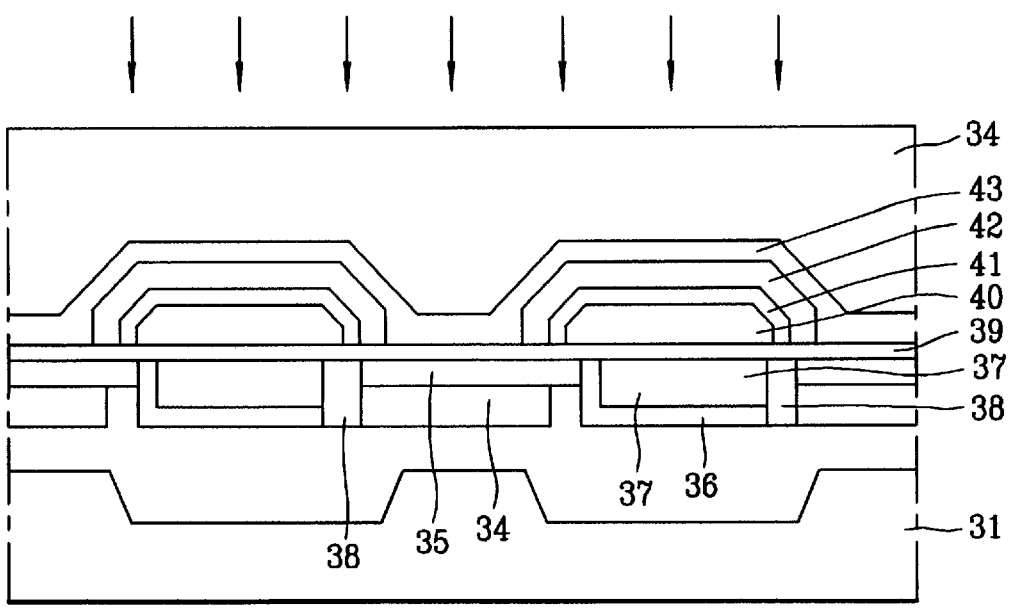

FIGS. 2a to 2c are cross-sectional views showing states of a solid state image pickup device during various steps of a manufacturing process, according to the first embodiment of the invention. According to the first embodiment of the invention, a solid state image pickup device is designed to effectively adjust thicknesses of a microlens layer and a planarizing layer by changing their refractive indexes.

Referring initially to FIG. 2a, first and second $p^-$-type wells 32 and 33 are formed in an n-type substrate 31. A photodiode of $n^+$-type PDN region 34 and an $n^+$-type VCCD region 37 are formed in first and second $p^-$-type wells 32 and 33, respectively. On the PDN region 34, there is formed a photodiode of p-type (PDP) region 35 which is used as a $p^{++}$-type surface isolation layer. A third $p^-$-type well 36 is formed to surround the $n^+$-type VCCD 37.

After the formation of the third $p_-$-type well 36, a channel stop layer 38 for isolating adjacent pixels is formed adjoining photodiode regions 34 and 35.

Subsequently, a gate insulating layer 39 is formed on the entire surface of the substrate 31, and over PDN and PDP regions 34 and 35. Next, a transmitting gate 40, an interlayer insulating layer 41, and a metal shading layer 42 are successively formed on the gate insulating layer 39. Thereafter, a passivation layer 43 is formed on the entire surface of the gate insulating layer 39.

Referring to FIG. 2b, after the formation of the passivation layer 43, a planarizing layer 44 is formed. To form the planarizing layer 44, a material is heated or baked at a high temperature after being deposited on passivation layer 43. Next, as shown by the arrows of FIG. 2b, an impurity ion-implanting process is performed to increase a refractive index of the planarizing layer 44. The impurity ions may include, e.g., argon (Ar).

Referring to FIG. 2c, a material is deposited on planarizing layer 44, which material is then patterned using a photolithographic process. Next, an ultraviolet (UV) exposure process and a reflow process are performed at a high temperature to form microlenses 45.

Another method for manufacturing a solid state image pickup device according to the second embodiment of the invention will be described below with reference to FIGS. 3a to 3c.

Figure 3A:
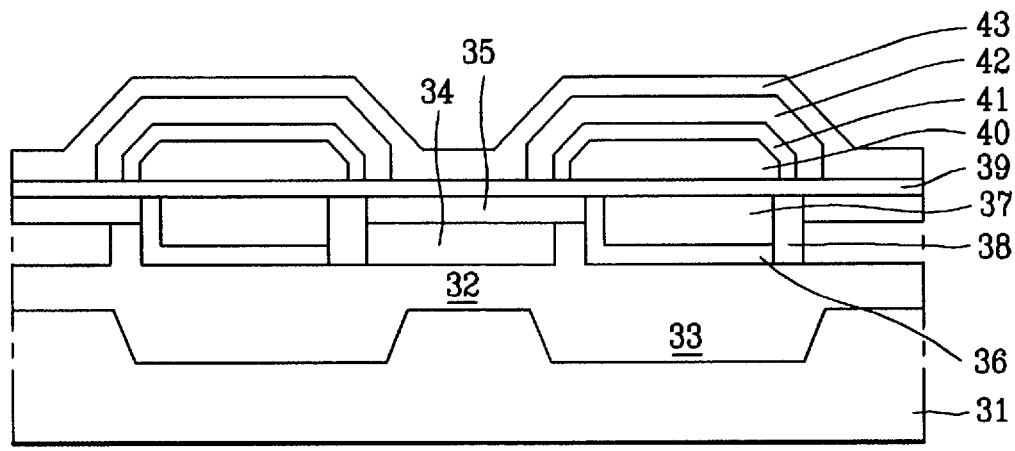
FIGS. 3a to 3c are cross-sectional views showing states of a solid state image pickup device during various steps of a manufacturing process therefor according to a second embodiment of the invention.
Figure 3B:
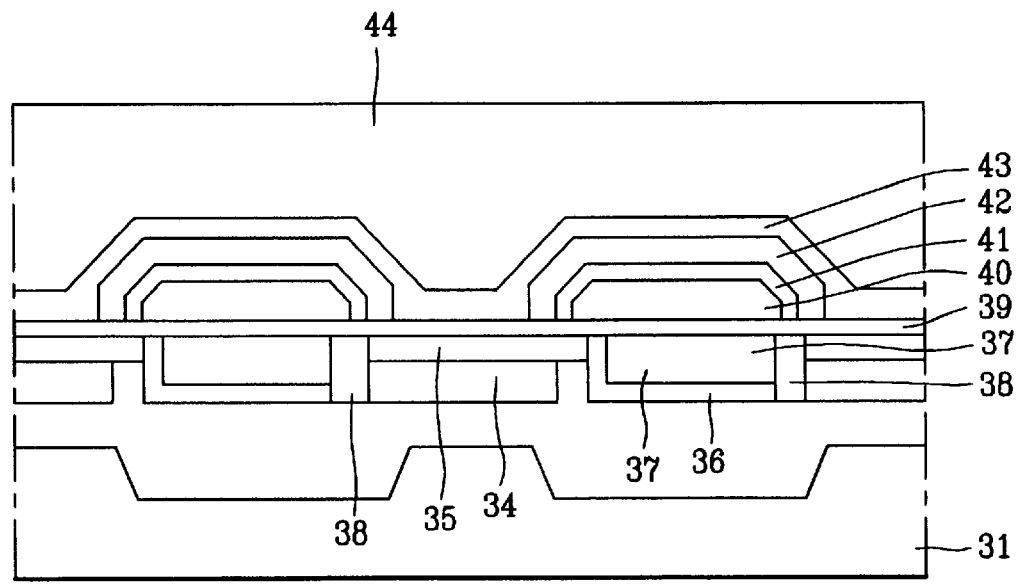

FIGS. 3a and 3b correspond to steps that are essentially the same as the steps discussed with respect to FIGS. 2a and 2b, respectively. For that reason, a detailed discussion of FIGS. 3a and 3b is omitted.

Figure 3C:
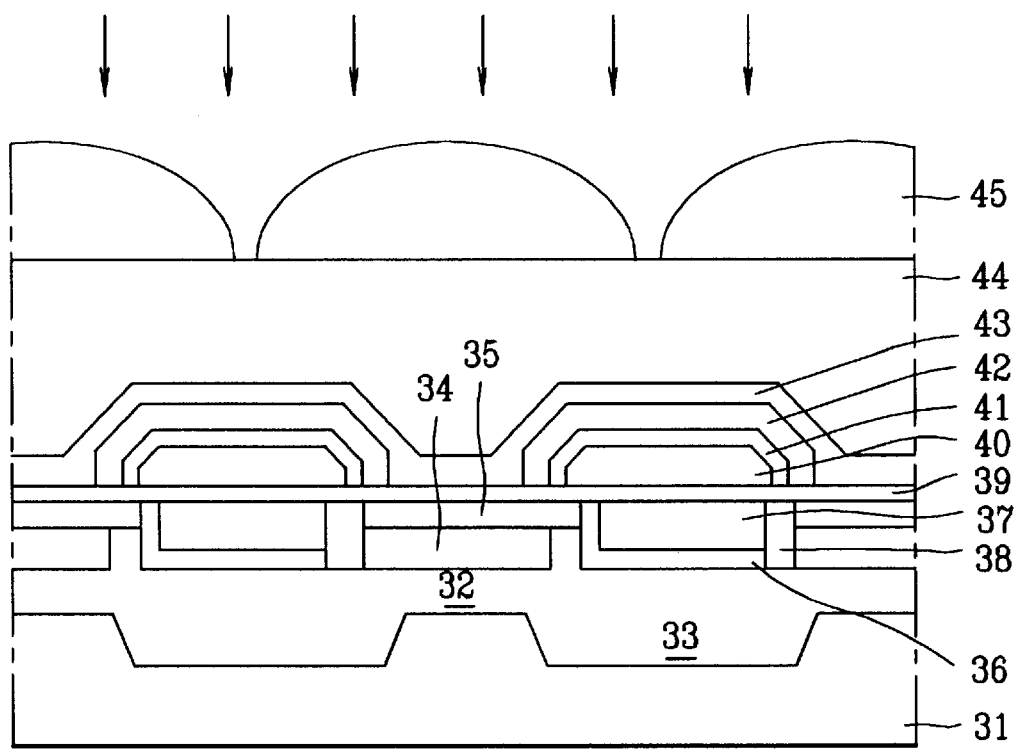

As shown in FIG. 3c, microlenses 45 are formed on planarizing layer 44. Specifically, a material is deposited on planarizing layer 44, which material is then patterned using photolithographic process (e.g., masking). Next, UV exposure and a reflow processes are performed at a high temperature to form microlenses 45. Thereafter, as shown by the arrows of FIG. 3c, impurity ions are implanted into the microlenses 45, so as to increase refractive index of those microlenses. The impurity ions implanted may include, e.g., Ar.

Still another method for manufacturing a solid state image pickup device according to the third embodiment of the invention will be described below with reference to FIGS. 4a and 4c.

According to the third embodiment of the invention, ions are implanted into both a planarizing layer and a microlens layer, thereby changing the refractive indexes of each of those layers.

Figure 4A:
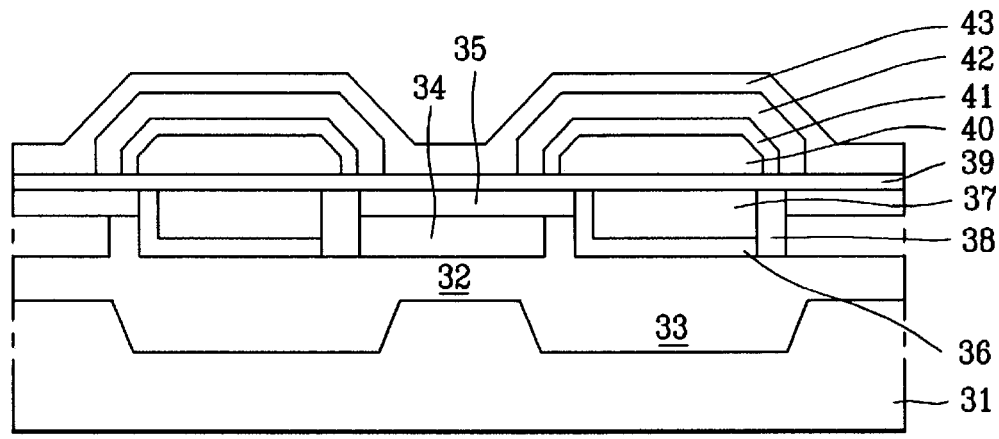
FIGS. 4a to 4c are cross-sectional views showing states of a solid state image pickup device during various steps of a manufacturing process therefor according to a third embodiment of the invention.
Figure 4B:
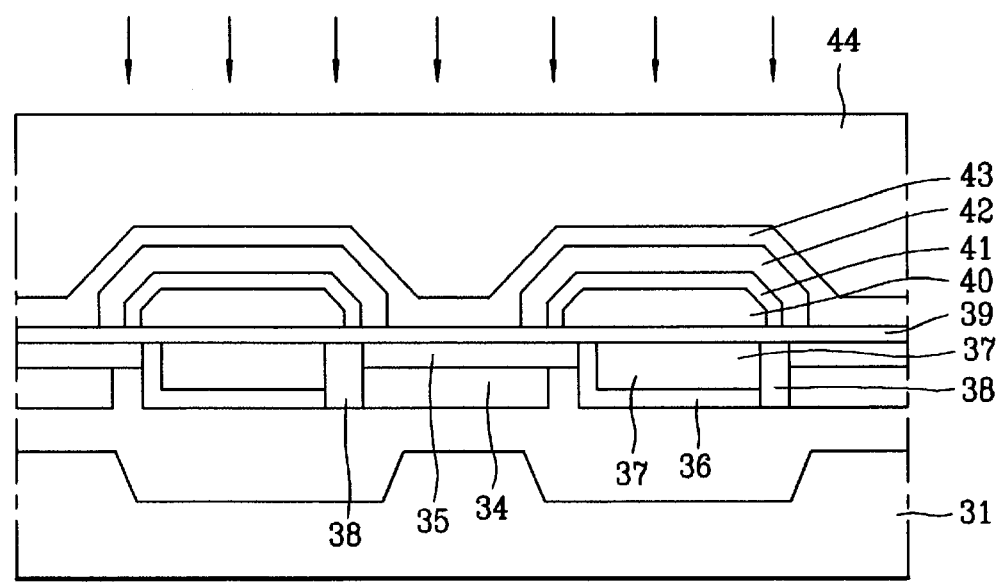
Figure 4C:
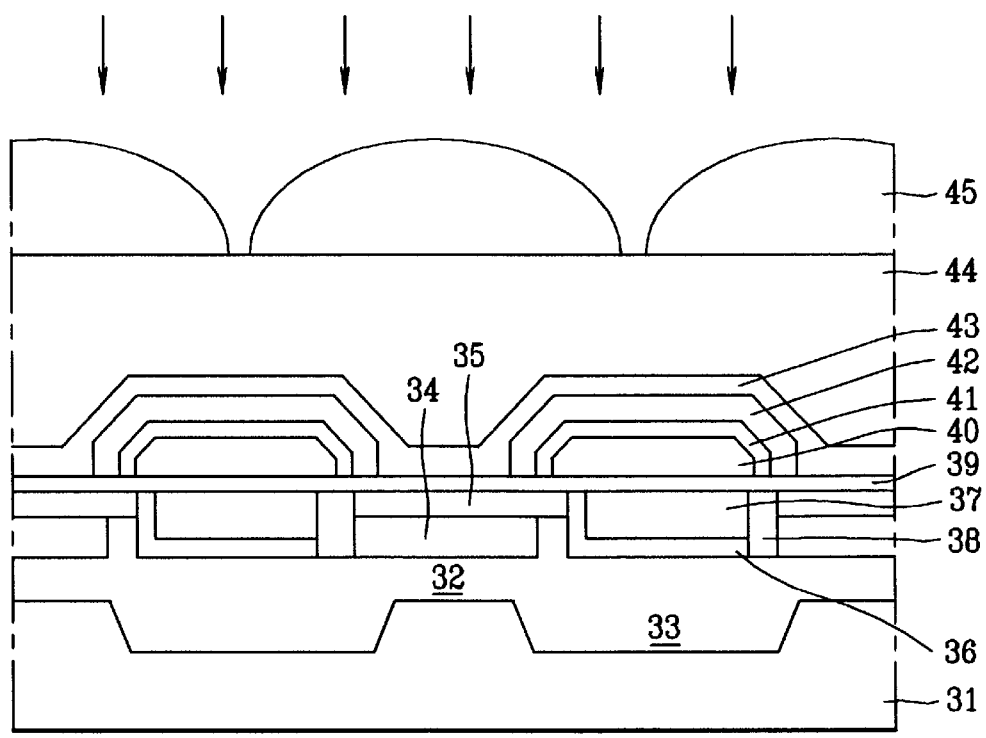

More specifically, FIG. 4a corresponds to steps that are essentially the same as the steps discussed with respect to FIG. 2c. For that reason, a detailed description of FIG. 3a is omitted. After passivation layer 43 is formed as shown in FIG. 4a, a planarizing layer 44 is formed thereon as shown in FIGS. 4b. To form planarizing layer 44, a material is deposited on passivation layer 43, which material is baked at a high temperature. Then, impurity ions are implanted into the planarizing layer 44, so as to increase its refractive index. Subsequently, as shown in FIG. 4c, a material for a microlens is deposited on planarizing layer 44, which material is patterned with a photolithographic process (e.g., masking). Next, an UV exposure and a reflow process are performed at a high temperature to form microlenses 45. The impurity ions implanted into the planarizing layer 44 at the microlenses 45 may contain Ar to increase the refractive index.

Moreover, according to the third embodiment of the invention, impurity ion implantation processes are performed in the planarizing layer 44 and the microlenses 45, respectively.

Figure 5A:
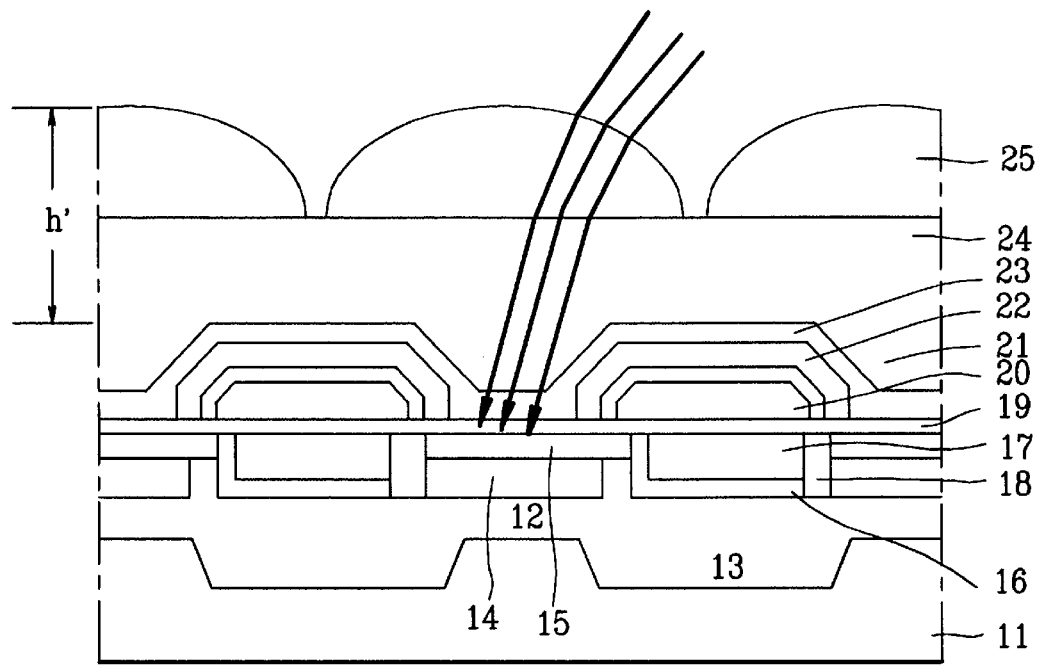
FIGS. 5a to 5b are cross-sectional views showing a structure of a solid state image pickup device and illustrating paths of incident light according to the invention.
Figure 5B:
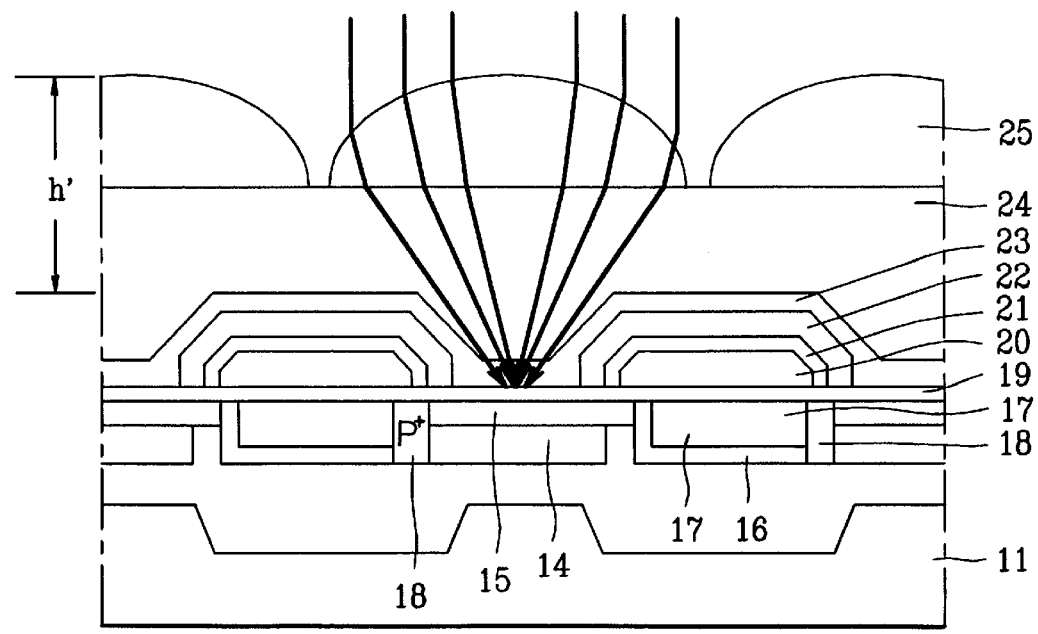

In the solid state image pickup devices corresponding to each embodiment of the present invention, light transmitted through a camera lens is focused on the photodiode regions via refraction through planarizing layer 44 and microlens 45, as shown in FIGS. 5a and 5b. Since the planarizing layer 44 and the microlens 45 have high refractive indexes, even light incident from an angle is focused on the photodiode regions (See FIG. 5a).

Light focused on the photodiode regions is photoelectrically converted into image charge. The image charge from the photodiode regions is transferred to a HCCD (not shown) in a vertical direction through the VCCD 37 according to a VCCD clock signal. The image charge is subsequently transferred in a horizontal direction using the HCCD. It is then sensed and amplified at a floating diffusion region, before being output to a periphery circuit.

FIGS. 6a and 6b each show measurements according to changes of refractive indexes both prior to, and after, an ion-implanting process.

Some advantages achieved by manufacturing a solid state image pickup device using the processes described above with respect to the invention are described in the following.

In the present invention, an ion implantation process may be applied to either a planarizing layer or a microlens layer to increase the refractive index of that particular layer. Alternatively, ion implantation processes may be applied to both a planarizing layer and a microlens layer to increase the refractive index of both layers, respectively. Due to the heightened refractive index of the planarizing layer and/or the microlens layer, incident light is precisely focused on the photodiode regions.

Furthermore, because this focus is achieved based on heightened refractive indexes, the image pickup device may have a thin construction. That is, the resulting image pickup device can be constructed thinner and lighter.

Still further, because the planarizing layer and/or the microlens layer have high refractive indexes, even light incident at an angle is precisely focused on the photodiode regions, effectively reducing the generation of smear and enhancing picture quality.

It will be apparent to those skilled in the art that various modification and variations can be made in the method for manufacturing a solid state image pickup device of the present invention without departing from the spirit or scope of the inventions. Thus, it is intended that the present invention cover the modifications and variations of this invention provided they come within the scope of the appended claims and their equivalents.

What is claimed is:

1. A method for manufacturing an image pickup device, the method comprising:

implanting impurity ions into at least one of a planarizing layer and a microlens layer positioned above the planarizing layer.

2. The method recited by claim 1, wherein:

the image pickup device is a solid state image pickup device, and the planarizing layer and the microlens layer are positioned at least one photoelectric conversion region and at least one charge coupled device region, the charge coupled device region transferring an image charge generated in the photoelectric conversion region in one direction.

3. The method recited by claim 1, wherein the impurity ions are implanted into both the planarizing layer and the microlens layer.

4. The method recited by claim 1, wherein the step of implanting impurity ions increases a refractive index of the layer being implanted.

5. The method recited by claim 3, wherein the step of implanting impurity ions increases a refractive index of the layer being implanted.

6. The method as claimed in claim 1, wherein the impurity ions contain argon (Ar).

7. The method as claimed in claim 3, wherein the impurity ions contain argon (Ar).

8. The method as claimed in claim 1, wherein the impurity ions are implanted so that a focal distance of light focused on a photoelectric conversion region of the image pickup device becomes shorter than a focal distance of light prior to implanting the impurity ions.

9. The method as claimed in claim 3, wherein the impurity ions are implanted so that a focal distance of light focused on a photoelectric conversion region of the image pickup device becomes shorter than a focal distance of light prior to implanting the impurity ions.

10. The method recited by claim 1, further comprising:

forming a plurality of photoelectric conversion regions in a semiconductor substrate;

forming a plurality of charge coupled device regions for transferring image charge generated in the photoelectric conversion regions in one direction;

forming a passivation layer above the photoelectric conversion regions and the charge coupled device regions;

forming a planarizing layer on the passivation layer; and forming a microlens layer on the planarizing layer.

11. The method as claimed in claim 10, wherein the impurity ions for changing a refractive index are implanted into both the microlens layer and the planarizing layer.

12. The method as claimed in claim 10, wherein the impurity ions are implanted so that a focal distance of light focused on the photoelectric conversion regions becomes shorter than a focal distance of light prior to implanting the impurity ions.

13. The method as claimed in claim 11, wherein the impurity ions are implanted so that a focal distance of light focused on the photoelectric conversion regions becomes shorter than a focal distance of light prior to implanting the impurity ions.

14. An image pickup device, the apparatus comprising:

a planarizing layer; and a microlens layer positioned above the planarizing layer, the planarizing layer and the microlens layer being positioned over an image pickup device, at least one of the planarizing layer and the microlens, layer being doped with impurity ions.

15. The apparatus recited by claim 14, wherein the image pickup device is a solid state image pickup device including at least one photoelectric conversion region and at least one charge coupled device region, the charge coupled device region transferring an image charge generated in the photoelectric conversion region in one direction.

16. The apparatus recited by claim 14, wherein both the planarizing layer and the microlens layer are doped with impurity ions.

17. The apparatus recited by claim 14, wherein an index of refraction of the layer doped with impurity ions is increased by the dopant.

18. The apparatus recited by claim 14, wherein an index of refraction of the planarizing layer and the microlens layer is increased by the dopant.

19. The apparatus as claimed in claim 14, wherein the impurity ions contain argon (Ar).

20. The apparatus as claimed in claim 16, wherein the impurity ions contain argon (Ar).

21. The apparatus as claimed in claim 14, wherein a focal distance of light focused on a photoelectric conversion region of the image pickup device becomes shorter than a focal distance of light prior to doping with the impurity ions.

22. The apparatus as claimed in claim 16, wherein a focal distance of light focused on a photoelectric conversion region of the image pickup device becomes shorter than a focal distance of light prior to doping with the impurity ions.

23. The apparatus r ecited by claim 14, further comprising:

a plurality of photoelectric conversion regions in a semiconductor substrate;

a plurality of charge coupled device regions for transferring image charge generated in the photoelectric conversion regions in one direction;

a passivation layer positioned above the photoelectric conversion regions and the charge coupled device regions;

a planarizing layer positioned on the passivation layer; and a microlens layer positioned on the planarizing layer.

24. The apparatus as claimed in claim 23, wherein both the microlens layer and the planarizing layer are doped with impurity ions for changing an index of refraction thereof.

25. The apparatus as claimed in claim 23, wherein a focal distance of light focused on the photoelectric conversion regions becomes shorter than a focal distance of light prior to doping with the impurity ions.

26. The apparatus as claimed in claim 24, wherein a focal distance of light focused on the photoelectric conversion regions becomes shorter than a focal distance of light prior to doping with the impurity ions.

* * * * *